United States Patent [19]
Saitoh

[11] Patent Number: 5,355,004
[45] Date of Patent: Oct. 11, 1994

[54] SEMICONDUCTOR INTEGRATED CIRCUIT DEVICE HAVING WIRING FOR CLOCK SIGNAL SUPPLY

[75] Inventor: Mutsuo Saitoh, Tokyo, Japan

[73] Assignee: NEC Corporation, Japan

[21] Appl. No.: 975,275

[22] Filed: Nov. 12, 1992

[30] Foreign Application Priority Data

Nov. 14, 1991 [JP] Japan .................. 3-297557

[51] Int. Cl.[5] ............... H01L 49/00; H01L 23/48; H01L 29/44; H01L 29/52
[52] U.S. Cl. ...................... 257/211; 257/208; 257/776; 257/773; 257/786; 307/406; 307/482.1
[58] Field of Search ............... 257/211, 208, 775, 776, 257/773; 307/409, 406, 480, 465.1, 303.1, 482.1

[56] References Cited

U.S. PATENT DOCUMENTS

| | | | |
|---|---|---|---|
| 4,197,555 | 4/1980 | Uehara et al. | 357/70 |
| 4,924,290 | 5/1990 | Enkaku et al. | 257/775 |
| 4,990,992 | 2/1991 | Uchida | 357/41 |
| 5,049,969 | 9/1991 | Orbach et al. | 357/51 |
| 5,055,716 | 10/1991 | El Gamel | 307/446 |

Primary Examiner—Andrew J. James
Assistant Examiner—T. M. Arroyo
Attorney, Agent, or Firm—Laff, Whitesel, Conte & Saret

[57] ABSTRACT

A semiconductor integrated circuit device wherein terminals other than clock signal terminals in circuit blocks are connected via a first wiring layer to a clock signal source and only the clock signal terminals in the blocks are connected via a second wiring layer to the source. The second wiring layer is formed above the first wiring layer and is connected to the clock signal terminals. Since the second wiring layer is dedicated to the clock signal, clock signal wiring can be laid out as desired when a layout is designed by a hierarchical design technique. There is no chance that propagation characteristics of the clock signals to the blocks deviates, and a cell area can be reduced. Preferably, a third wiring layer connected to the second wiring layer is furthermore provided for dedication to the clock signal.

4 Claims, 4 Drawing Sheets

SEMICONDUCTOR INTEGRATED CIRCUIT DEVICE HAVING WIRING FOR CLOCK SIGNAL SUPPLY

BACKGROUND OF THE INVENTION

1. Field of the Invention

This invention relates to a semiconductor integrated circuit device and more particularly, to a semiconductor integrated circuit device to which an improvement has been made with respect to a layout of wiring for supplying clock signals to circuit blocks constituting the integrated circuit.

2. Description of the Prior Art

For semiconductor integrated circuit devices which perform a desired circuit operation by combining cells for providing the basic function and wiring them, the number of steps and the processing time required to design a layout of the cells and wiring thereof increase exponentially as the semiconductor integrated circuit devices become large scaled. Thus, if an attempt is made to design a layout of the entire integrated circuit at a time, enormous time and labor are required. Then, recently a "hierarchical design technique" is widely used as a method for reducing the time and labor required for the layout design.

The "hierarchical design technique" is a technique by which an integrated circuit is divided into circuit blocks easy to handle in scale and a layout of the circuit blocks and wiring in the circuit blocks is determined except for macro blocks where a layout of devices and wiring thereof is previously determined, then a layout of wiring between all the circuit blocks containing the macro blocks is joined.

In case of designing a layout of a semiconductor integrated circuit device by the hierarchical design technique, it is important to lay out wiring 'between circuit blocks so as to synchronously supply a clock signal from a clock signal source to the clock signal input terminal of each of the circuit blocks. The following specific layout methods are known: Connecting the clock signal source and each of the clock signal input terminals by a separate line, and branching one line connected to the source at an intermediate point and connecting the branches to the clock signal input terminals.

FIG. 2 shows a D-latch flip-flop circuit wherein D is a data signal input terminal, CLK is a clock signal input terminal, Q is a non-inverted signal output terminal, and Q is an inverted signal output terminal. A circuit block B connected to the clock signal input terminal CLK is made up of two inverters INV1 and INV2 connected in series each other.

FIG. 1 shows a layout of devices and wiring in the circuit block B of the flip-flop circuit shown in FIG. 2. In the layout in FIG. 1, both the inverters INV1 and INV2 are of CMOS (complementary metal-oxide-semiconductor) structure.

In FIG. 1, a pair of p-channel MOS (metal-oxide-semiconductor) transistors M1 and M3 are formed in an n-type well W1 formed in a p-type semiconductor substrate and a pair of n-channel MOS transistors M2 and M4 are formed in the semiconductor substrateoutside the well W1. The MOS transistors M1 and M2 constitute the invereter INV1 and the MOS transistors M3 and M4 constitute the invereter INV2.

In an electroconduitive layer nearest to the substrate, polycrystalline silicon layers G1 and G2 are formed in parallel (in the vertical direction in FIG. 1)across the area in which the transistors M1 and M3 are formed and the area in which the transistors M2 and M4 are formed. The polycrystalline silicon layer G1 is used for both gate electrodes and gate electrode wiring of the transistors M1 and M2 and the polycrystalline silicon layer G2 is used for both gate electrodes and gate electrode wiring of the transistors M3 and M4.

Aluminum layers A1, VDD, and GND are formed above the polycrystalline silicon layers G1 and G2. The aluminum layer A1 is connected via contact holes C1 and C2 respectively to the drains of the transistors M1 and M2, via contact holes C5 and C6 respectively to the drains of the transistors M3 and M4, and via contact holes C7 to the polycrystalline silicon layer G2. The aluminum layer VDD is connected via contact holes C3 to the sources of the transistors M1 and M3 and is also connected to a power source. The aluminum layer GND is connected via contact holes C4 to the sources of the transistors M2 and M4 and is also grounded to the substrate. These aluminum layers A1, VDD, and GND exist wi thin one layer.

A line L1 in the circuit block B shown in FIG. 2 corresponds to the polycrystalline silicon layer G1, a line L2 to the aluminum layer A1 connecting the contact holes C1, C2, and C7, a line L3 to the aluminum layer A1 extending to the right of FIG. 1 from the contact holes C7, and a line L4 to the aluminum layer A1 extending toward the right side of FIG. 1 from the contact holes C5.

The clock signal CLK from the clock signal source is supplied to the polycrystalline silicon layer G1 which act as the gate electrodes of the transistors M1 and thereby the transistors M1 and M2 or the inverter INV1 being operated. An output signal of the inverter INV1 is supplied through the aluminum layer A1 to the polycrystalline silicon layer G2 which acts as the gate electrodes of the transistors M3 and M4, thereby the transistors M3 and M4 or the inverter INV2 being operated. An output signal of the inverter INV2 is fed through the aluminum layer A1 to other circuits.

In FIG. 1, it is necessary to connect the polycrystalline silicon layer G1 to a clock signal line (not shown) formed in a wiring area outside the circuit block B and furthermore to a polycrystalline silicon layer for clock signals for other circuit blocks (not shown), so that the ends of the polycrystalline silicon layer G1 are formed protruding from the circuit block B.

A conventional semiconductor integrated circuit device having the above-mentioned layout requires that the polycrystalline silicon layer G1 is connected to the clock signal line formed in the wiring area of circuit blocks, thus the length of the polycrystalline silicon layer G1 becomes long, as a result, a problem of an increase in the cell area arises.

In addition, since the wiring length from the clock signal source to the clock input terminal of each circuit block varies depending on the circuit configuration of the circuit block, another problem that the clock signal characteristic deviate due to the differences in the clock signal routes and in the load state of the circuit blocks is arises.

SUMMARY OF THE INVENTION

Accordingly, an object of the invention is to provide a semiconductor integrated circuit device in which there is not a chance that the characteristic of the clock signal fed into the circuit blocks deviates even if the clock signal routes and the load state of the circuit blocks are differerent from each other.

Another object of the invention is to provide a semiconductor integrated circuit device in which the cell area can be reduced compared with that of the conventional semiconductor integrated circuit device.

According to the invention, there is provided a semiconductor integrated circuit device which comprises a plurality of circuit blocks each having a clock signal terminal to which a clock signal is supplied from a clock signal source, a first wiring layer for connecting terminals other than the clock signal terminals in the circuit blocks, and a second wiring layer for connecting only the clock signal terminals in the circuit blocks to the clock signal source. The second wiring layer is formed above or below the first wiring layer and is connected to the clock signal source.

The semiconductor integrated circuit device of the invention uses the second wiring layer dedicated to the clock signal for wiring the clock signal to the circuit blocks and the first wiring layer for wiring other than the clock signals, thus when a layout of the second wiring layer for the clock signals is designed by using the hierarchical design technique, unlike the conventional device described above, the semiconductor integrated circuit device of the invention lessens the need for considering a layout of the first wiring layer. When a layout is designed, the second wiring layer is laid out preferentially so that the distance between the clock signal source and one of the circuit blocks is made equal to that between the clock signal source and another of the circuit blocks, thereby eliminating a chance that the characteristic of the clock signal supplied to the circuit blocks deviates even if the clock signal routes and the load state of the circuit blocks are different from each other.

Since the clock signal is supplied via the dedicated second wiring layer, unlike the conventional device, the first wiring layer need not be extended to the outside of the circuit blocks and the cell area can also be reduced compared with that of the conventional device.

Furthermore, since the second wiring layer for the clock signal is formed above the first wiring layer, it is not necessary to limit the second wiring layer within the wiring area between the circuit blocks, as a result, there is also provided an advantage that the second wiring layer can be laid out as desired.

The circuit blocks are not particularly limited and can be used as desired if they have a clock signal terminal each. The circuit blocks contain not only circuit blocks set as desired by the designer when designing a layout, but also circuit cells, or macro cells, having the standard function previously designed.

As the first wiring layer, an aluminum wiring layer is generally used, but any desired wiring layer made of other material can be used if it can be used as a wiring layer of the semiconductor integrated circuit device.

As the second wiring layer, an aluminum wiring layer is preferably used, but any desired wiring layer made of other material can be used if it can be used as a wiring layer of the semiconductor integrated circuit device.

In one preferred embodiment, a part of the first wiring layer contains a connection layer insulated from lines for connecting the terminals other than the clock signal terminals and the second wiring layer is connected through the connection layer to the clock signal terminals. In this embodiment, the connection layer is preferably formed above or below at least one of the circuit blocks.

In another preferred embodiment, a third wiring layer is provided above the second wiring layer, which is dedicated to the clock signal and connected to the second wiring layer and the clock signal source. In this embodiment, clock signal wiring can be laid out by using not only the second wiring layer, but also the third wiring layer, thus there arises provided an advantage that a layout can be made still more as desired.

In still another embodiment, one of the second and third wiring layers is used as the connection layer which connects the other thereof to said first wiring layer. In this embodiment, there also arises provided an advantage that a layout can be made still more as desired.

The number of the wiring layers dedicated to the clock signal may be made three or more as required.

DESCRIPTION OF THE PREFERRED EMBODIMENTS

Preferred embodiments of the invention will be described below while referring to FIGS. 3 and 4.

First embodiment

Figure 1:
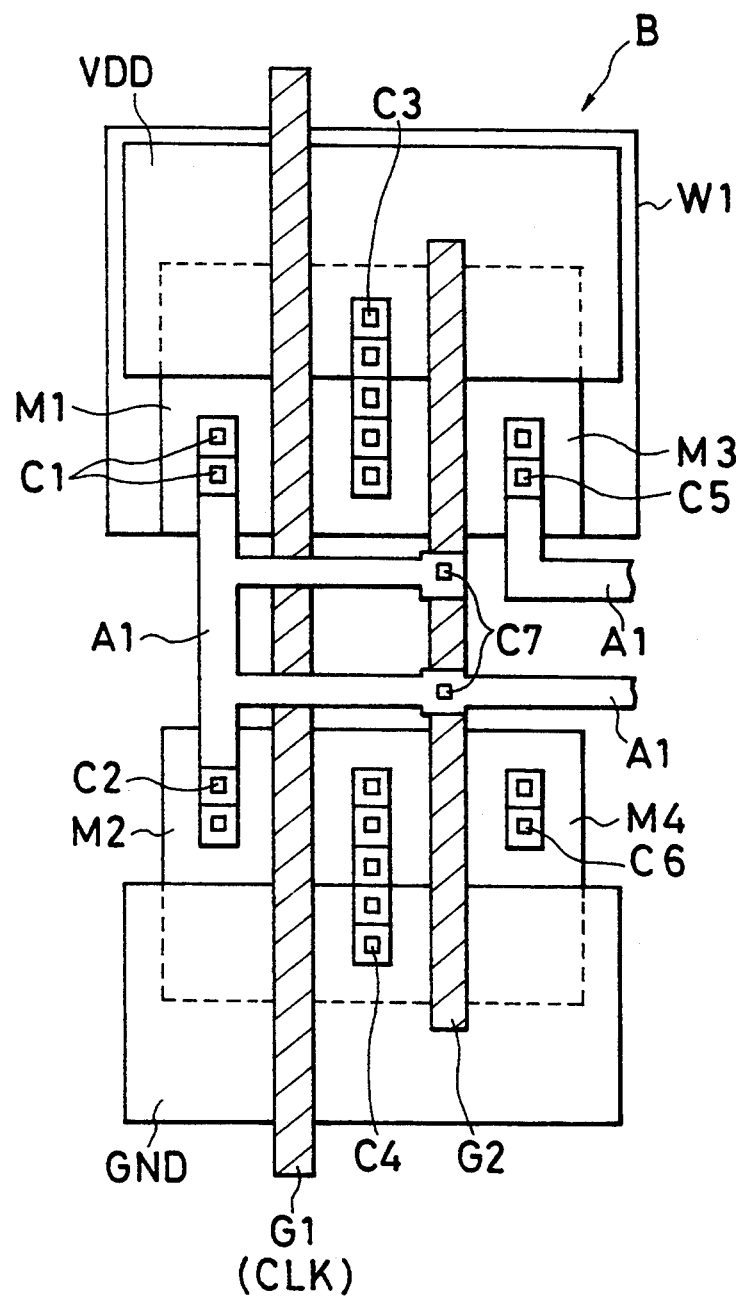
FIG. 1 is a layout diagram of a conventional semiconductor integrated circuit device and shows a layout of a circuit block constituting a part of a D-latch flip-flop circuit shown in FIG. 2.
Figure 2:
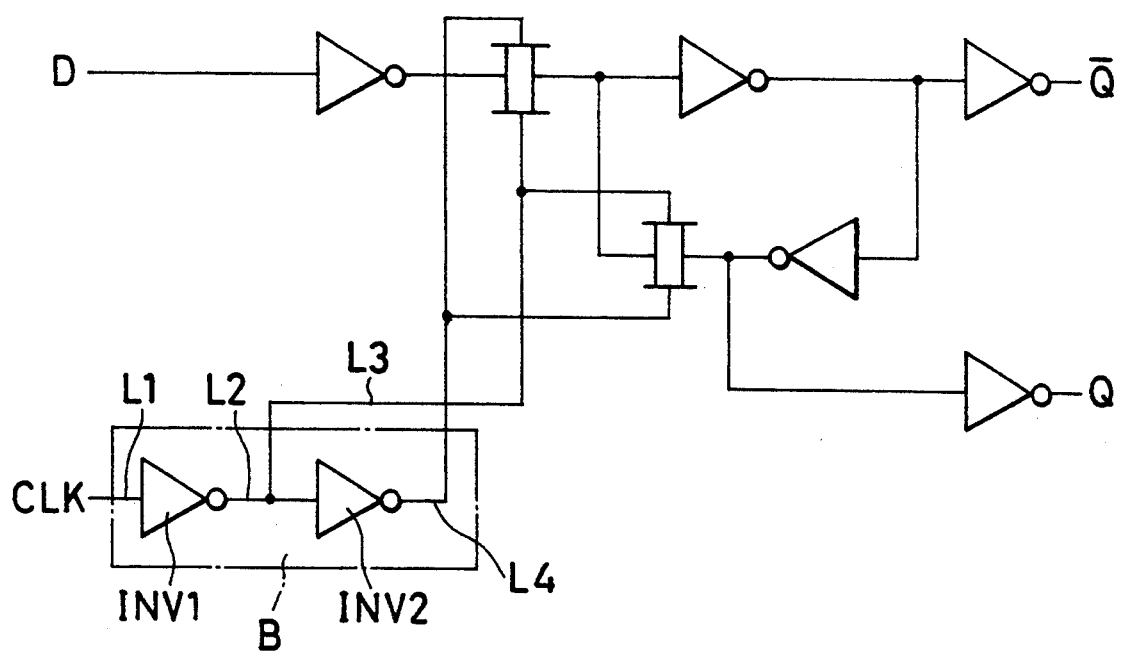
FIG. 2 is a circuit diagram showing an example of a D-latch flip-flop circuit.
Figure 3:
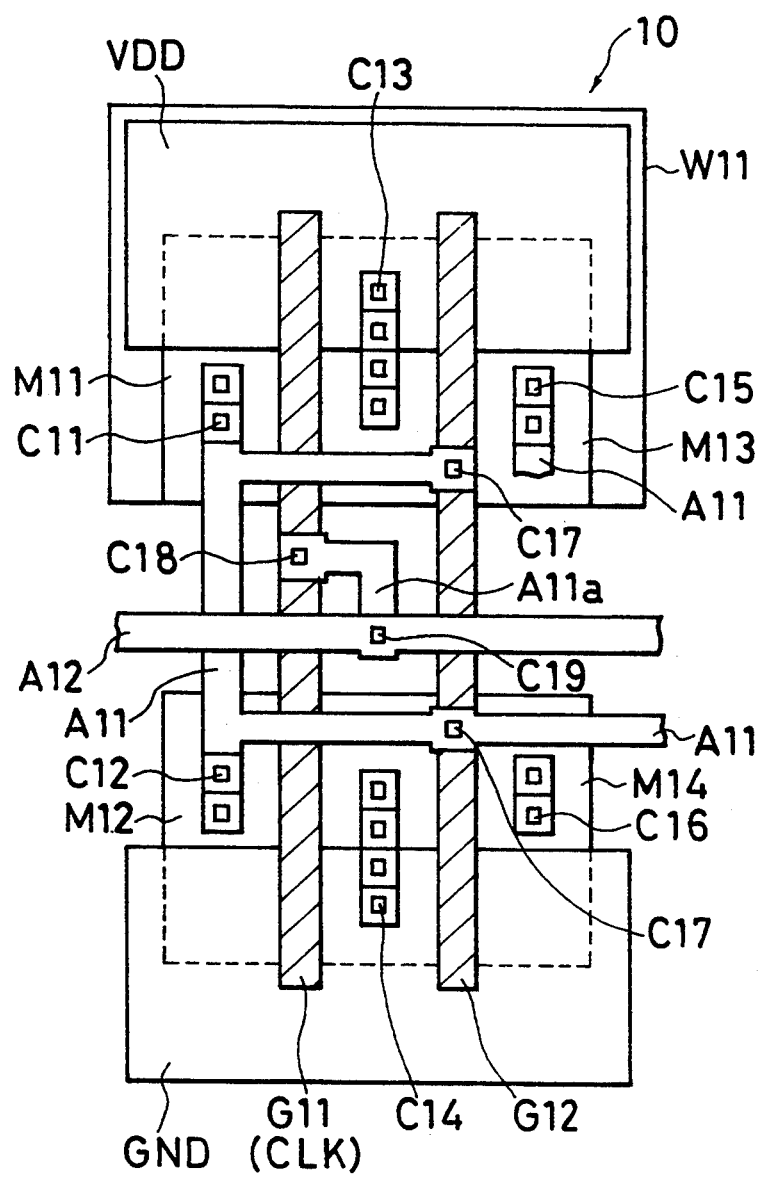
FIG. 3 is a layout diagram of a semiconductor integrated circuit device of a first embodiment of this invention.

FIG. 3 shows a layout of a semiconductor integrated circuit device of a first embodiment of the invention, in which the layout of the same circuit as the circuit block B of the D-latch flip-flop in FIG. 2 is shown as in FIG. 1.

In a circuit block 10 in FIG. 3, a pair of p-channel MOS transistors M11 and M13 are formed in an n-type well W11 formed in a p-type semiconductor substrate and a pair of n-channel MOS transistors M12 and M14 are formed in the semiconductor substrate outside the well W11. The MOS transistors M11 and M12 constitute the inverter INV1 and the MOS transistors M13 and M14 constitute the inverter INV2. In the embodiment, both of the inverters INV1 and INV2 are of CMOS structure.

In a electroconductive layer nearest to the substrate, polycrystalline silicon layers G11 and G12 are formed in parallel (in the vertical direction in FIG. 3) across the area in which the transistors M11 and M13 are formed and the area in which the transistors M12 and M14 are formed. The polycrystalline silicon layer G11 act as both gate electrodes and gate electrode wiring of the transistors M11 and M12 and the polycrystalline silicon layer G12 act as both gate electrodes and gate electrode wiring of the transistors M13 and M14.

Aluminum layers A11, VDD, and GND are formed above the polycrystalline silicon layers G11 and G12, which are insulated from the layers G11 and G12 and exist within one layer. The aluminum layer A11, VDD, and GND constitute a first wiring layer. The aluminum layer A11 is connected via contact holes C11 and C12 respectively to the drains of the transistors M11 and M12, via contact holes C15 and C16 respectively to the drains of the transistors M13 and M14, and via contact holes C17 to the polycrystalline silicon layer G12. The aluminum layer VDD is connected via contact holes C13 to the sources of the transistors M11 and M13 and is also connected to a power source. The aluminum layer GND is connected via contact holes C14 to the sources of the transistors M12 and M14 and is also grounded to the substrate.

This layout is almost the same as that of the conventional semiconductor integrated circuit device described in conjunction with FIG. 1 except that neither of the ends of the polycrystalline silicon layers G11 and G12 protrudes from the outside of the circuit block 10. However, in the semiconductor integrated circuit device of the embodiment, an aluminum layer A11a substantially like an L character is furthermore formed in the area surrounded by the aluminum layer A11 and is connected via contact holes C18 to the polycrystalline silicon layer G11 below the contact holes. The aluminum layer A11a exists within the layer formed of the aluminum layer A11, VDD and GND of the first wiring layer.

In the semiconductor integrated circuit device of the embodiment, an aluminium layer A12 insulated from the first wiring layer is provided above the first wiring layer. The aluminum layer A12 is used as a layer dedicated to clock signal supply, and constitutes a second wiring layer. Here, the aluminum layer A12 is formed like a strip extending in the horizontal direction of FIG. 3, which is connected via contact holes C19 to the aluminum layer A11a below the layer A12. Therefore, the aluminum layer A12 is connected via the aluminum layer A11a to the polycrystalline silicon layer G11 and a clock signal can be supplied through the aluminum layer A12 to the polycrystalline silicon layer G11.

Here, the aluminum layer A12 is formed like a strip so that the layer A12 is made perpendicular to the polycrystalline silicon layer G11, but the aluminum layer A12 belongs to the second wiring layer, different from the aluminum layer A11, thus can be made any desired form. For example, it may be formed like a strip parallel to the polycrystalline silicon layer G11. Likewise, although the aluminum layer A11a connecting the polycrystalline silicon layer G11 and the aluminum layer A12 is here formed like an L character, if the layer A11 can be made any desired form if it connects both the layers G11 and A12.

In the embodiment, the line L1 in the block B in FIG. 2 corresponds to the aluminum layers A12 and A11a and the polycrystalline silicon layer G11. Other lines correspond to the aluminum layers in the same manner as in the conventional semiconductor integrated circuit device shown in FIG. 1. That is, the line L2 corresponds to the aluminum layer A11 connecting the contact holes C11, C12, and C17, the line L3 to the aluminum layer A11 extending toward the right side of FIG. 3 from the contact holes C17, and the line L4 to the aluminum layer A11 connected to the contact holes C15.

The clock signal CLK from the clock signal source is supplied through the aluminum layers A12 and A11a to the polycrystalline silicon layer G11 which act as the gate electrodes of the transistors M11 and M12, thereby the transistors M11 and M12, that is, the inverter INV1 being operated. An output signal of the inverter INV1 is supplied through the aluminum layer A11 to the polycrystalline silicon layer G12 which act as the gate electrodes of the transistors M13 and M14, thereby the transistors M13 and M14, that is, the inverter INV2 being operated. An output signal of the inverter INV2 is fed through the aluminum layer A11 to other circuits.

As described above, in the semiconductor integrated circuit device of the invention, the clock signal CLK is supplied to the transistors M11 and M12 via the aluminum layer A12 which is a dedicated wiring layer thereof, thus clock signal wiring can be laid out without being bound to the layout of the polycrystalline silicon layer G11. Then, clock signal wiring to the circuit blocks is laid out so as to connect preferentially to the aluminum layer A12 so that the wiring lengths are equal to each other, thereby eliminating a chance that the propagation characteristic of the clock signal CLK supplied to the circuit blocks deviates even if the clock signal routes and the load state of the circuit blocks are different from each other.

Moreover, since the clock signal CLK is supplied via the aluminum layer A12 which is a dedicated wiring layer, unlike the conventional device, the polycrystalline silicon layer G11 need not be extended to the outside of the circuit block 10, so that the cell area can be reduced comppared with that of the conventional device as above-described. In addition, since wiring of the polycrystalline silicon layer G11 becomes short, parasitic resistance does not occur.

Furthermore, since the clock signal line need not be limited within the wiring area between the circuit blocks, there is also provided an advantage that the clock signal line can be laid out as desired.

Second embodiment

Figure 4:
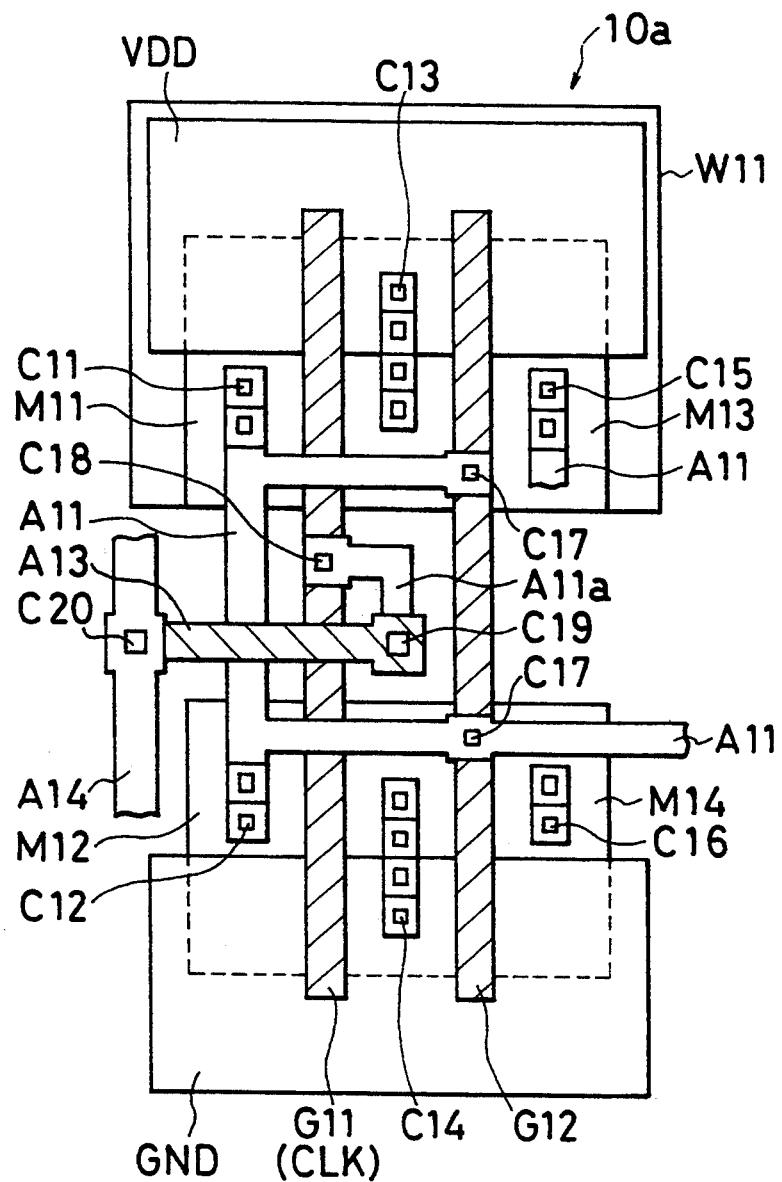
FIG. 4 is a layout diagram of a semiconductor integrated circuit device of a second embodiment of this invention.

FIG. 4 shows a second embodiment of the invention. The second embodiment is the same as the first embodiment except that two wiring layers dedicated to the clock signal are laminated. Therefore, the same or corresponding parts are designated by the same reference numerals in the first embodiment and detailed description is omitted.

In a circuit block 10a in FIG. 4, the inverters INV1 and INV2 of CMOS structure are formed as in the first embodiment, furthermore, the polycrystalline silicon layers G11 and G12 are formed in parallel in the electroconductive layer nearest to the substrate, the aluminum layers A11, VDD, GND, and A11a are formed in the first wiring layer above the polycrystalline silicon layers G11 and G12, and an aluminum layer A13 as the second wiring layer is formed above the first wiring layer. Furthermore, an aluminum layer A14 which constitutes a third wiring layer is formed above the second wiring layer. The aluminum layer A14 is insulated from the second wiring layer.

Here, the aluminum layer A14 as the third wiring layer is formed like a strip extending in the vertical direction of FIG. 4 and is connected via contact holes 20 to the aluminum layer A13 as the second wiring layer. The aluminum layer A13 is connected via contact holes C19 to the aluminum layer A11a below the aluminum layer A13 and the aluminum layer A11a is connected via contact holes C18 to the polycrystalline silicon layer G11 below the aluminum layer A11a. Therefore, the aluminum layer A14 is connected via the aluminum layers A13 and A11a to the polycrystalline silicon layer G11 and the clock signal CLK can be supplied through the aluminum layers A13 and A11a to the polycrystalline silicon layer G11.

Thus, in the second embodiment, clock signal lines to the circuit blocks can be laid out with the aluminum layer A14 as the third wiring layer being dedicated to the clock signal CLK, so that clearly the same effect as the first embodiment can be obtained.

In the circuit block 10a, unlike the first embodiment, the aluminum layer A13 as the second wiring layer serves only to connect the aluminum layer A14 as the third wiring layer and the aluminum layer A11a as a part of the first wiring layer to each other, thus takes a form as shown in FIG. 4, but may take any other desired form as a matter course. The aluminum layer A14 can also be formed as desired in accordance with the layout of other circuit blocks, etc.

In FIG. 4, the clock signal CLK is supplied from the aluminum layer A14 through the aluminum layer A13 to the polycrystalline silicon layer G11, but the aluminum layer A14 may also be connected directly to the polycrystalline silicon layer G11 not via the aluminum layer A13 to supply the clock signal CLK.

Since the clock signal CLK is also supplied to the aluminum layer A13 as the second wiring layer, the aluminum layer A13 can also be used as a clock signal dedicated line. Therefore, if the aluminum layer A13 in FIG. 4 is extended to any other circuit block, it is made possible to supply the clock signal CLK to the circuit block simply by connecting the block to the aluminum layer A13.

In the first and second embodiments, the circuit blocks containing the inverters using the MOS transistors are described, however, there is no doubt that the invention is also applicable to circuit blocks of other configurations.

What is claimed is:

1. A semiconductor integrated circuit device comprising:
    a plurality of circuit blocks each having a first terminal to which a clock signal is supplied and a second terminal through which a signal other than said clock signal is sent;
    a first wiring pattern electrically connected to said second terminals in said plurality of circuit blocks, said first wiring pattern being disposed in a first plane of said device; and
    a second wiring pattern electrically connected to said first terminals in said plurality of circuit blocks, said second wiring pattern being electrically insulated from said first wiring pattern and disposed in a second plane of said device, said second plane being above said first plane in said device;
    said clock signal being supplied through said second wiring pattern and said first terminals to said plurality of said circuit blocks; each of said circuit blocks having a third wiring pattern connected to said first terminals and disposed in a third plane of said device which is below said first plane; and
    said third wiring pattern does not extend outside of an individually associated one of said circuit blocks.

2. The semiconductor integrated circuit device as claimed in claim 1, wherein
    said third wiring pattern is made of a polysilicon layer.

3. The semiconductor integrated circuit device as claimed in claim 2, wherein
    said polysilicon layer is a gate electrode of an MOS transistor.

4. A semiconductor integrated circuit device comprising:
    a plurality of circuit blocks each having a first terminal to which a clock signal is supplied and a second terminal through which a signal other than said clock signal is sent;
    a first wiring pattern electrically connected to said second terminals in said plurality of circuit blocks, said first wiring pattern being disposed in a first plane of said device;
    a second wiring pattern electrically connected to said first terminals in said plurality of circuit blocks, said second wiring pattern being electrically insulated from said first wiring pattern and disposed in a second plane of said device, said second plane being above said first plane in said device;
    said clock signal being supplied through said second wiring pattern and said first terminals to said plurality of said circuit blocks; each of said circuit blocks having a third wiring pattern connected to said first terminals and is disposed in a third plane of said device which is below said first plane; and
    said third wiring pattern of said circuit blocks are not connected to each other.

* * * * *